United States Patent [19]

Kim

[11] Patent Number: 5,519,347

[45] Date of Patent: May 21, 1996

[54] START-UP CIRCUIT FOR STABLE POWER-ON OF SEMICONDUCTOR MEMORY DEVICE

[75] Inventor: Myong-Jae Kim, Kyungki-do, Rep. of Korea

[73] Assignee: Samsung Electronics Co., Ltd., Suwon, Rep. of Korea

[21] Appl. No.: 337,200

[22] Filed: Nov. 7, 1994

[30] Foreign Application Priority Data

Nov. 8, 1993 [KR] Rep. of Korea .................. 23597/1993

[51] Int. Cl.⁶ .................................................. H03K 17/22
[52] U.S. Cl. .......................... 327/143; 327/63; 327/198
[58] Field of Search .......................... 327/63, 143, 198, 327/545, 546

[56] References Cited

U.S. PATENT DOCUMENTS

| | | | |
|---|---|---|---|
| 4,142,118 | 2/1979 | Guritz | 327/143 |
| 4,245,150 | 1/1981 | Driscoll et al. | 327/143 |
| 4,634,905 | 1/1987 | Campbell, Jr. | 327/143 |
| 4,716,322 | 12/1987 | D'Arrigo et al. | 327/143 |
| 5,144,159 | 9/1992 | Frisch et al. | 327/143 |
| 5,214,316 | 5/1993 | Nagai | 327/143 |
| 5,378,936 | 1/1995 | Kokubo et al. | 327/143 |

FOREIGN PATENT DOCUMENTS

| | | | |
|---|---|---|---|
| 4-265012 | 9/1992 | Japan | 327/143 |
| 4-321315 | 11/1992 | Japan | 327/143 |
| 5-22100 | 1/1993 | Japan | 327/143 |

Primary Examiner—Terry Cunningham

[57] ABSTRACT

The present invention provides a start-up circuit including a differential amplifier receiving the internal power supply voltage as a source voltage and being driven by the reference signal, such that a level for the power supply voltage is accurately detected. The start-up circuit may also include a driver amplifying an output signal from the differential amplifier to a control signal, and a delay circuit receiving the control signal, delaying the control signal for a time period, and applying the delayed control signal to the differential amplifier.

9 Claims, 5 Drawing Sheets

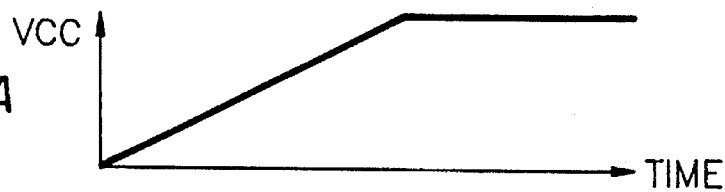
FIG. 7A
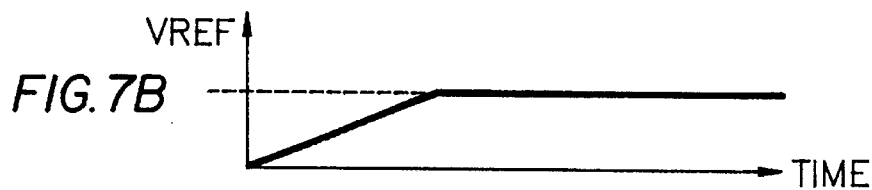
FIG. 7B
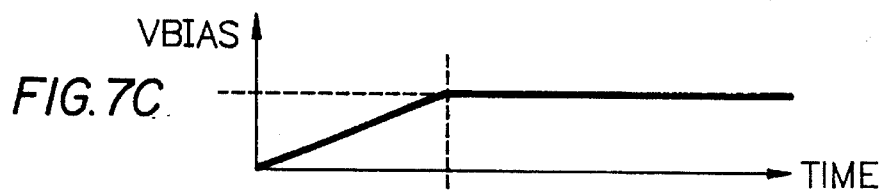
FIG. 7C
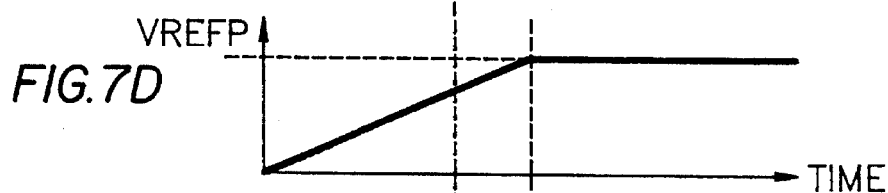
FIG. 7D
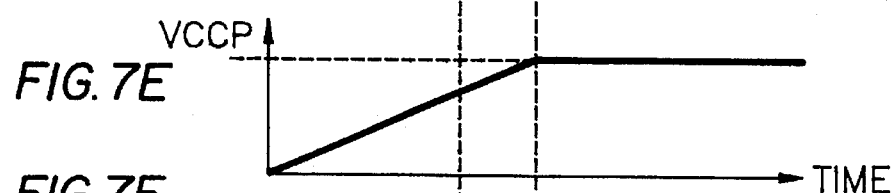
FIG. 7E
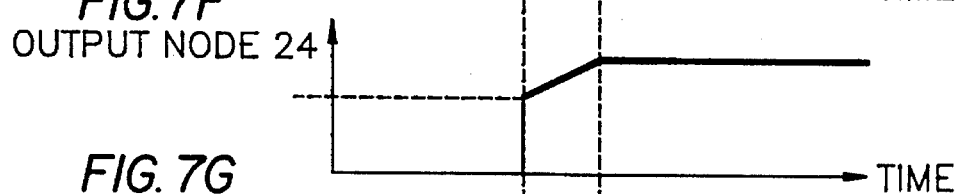
FIG. 7F OUTPUT NODE 24
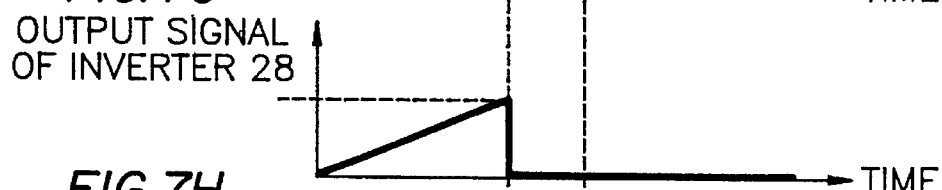
FIG. 7G OUTPUT SIGNAL OF INVERTER 28
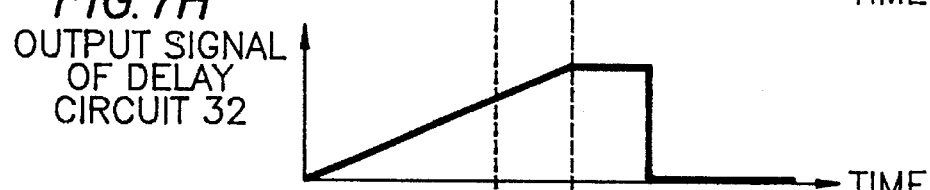
FIG. 7H OUTPUT SIGNAL OF DELAY CIRCUIT 32
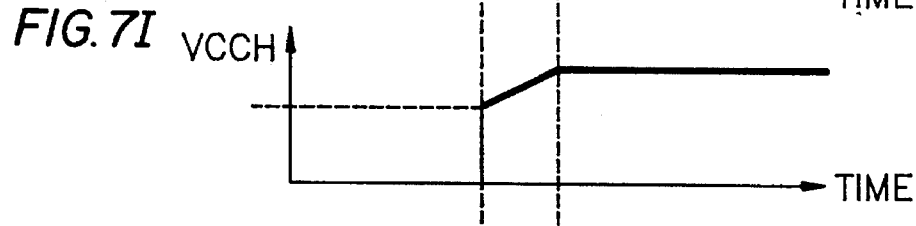
FIG. 7I VCCH

START-UP CIRCUIT FOR STABLE POWER-ON OF SEMICONDUCTOR MEMORY DEVICE

The present invention relates to a semiconductor memory device, and more particularly, to a start-up circuit which provides stable power-on operation of a semiconductor memory device.

Conventional start-up circuits are used in semiconductor memory devices to "start," one or more circuits internal to the semiconductor memory device when the power supply voltage rises to a predetermined voltage level upon "power-on" of the memory device. Start-up circuits must accurately sense the level of the power supply voltage which is typically provided by a source external to the memory device. However, it is not easy to accurately sense a level of the power supply voltage because of the changing ambient temperature of the memory device, and inherent instability of the power supply voltage source. Thus, it is difficult to accurately and consistently start the internal circuits in the memory device at the proper, predetermined power supply voltage level. The foregoing problem has only been exacerbated by the steadily decreasing power supply voltages used to operate more highly integrated memory devices.

The problem of stable start-up and the incumbent problem of accurate power supply voltage level detection have previously been addressed. For example, Korean Patent application No. 91-23343 filed Dec. 18, 1991 by the present applicant and entitled "Refresh Timer Corresponding to a Plurality of Operation Voltage" addresses several aspects of the foregoing problems. The structure of the start-up circuit disclosed in the aforementioned document is characterized by a resistor and a capacitor serially connected between a power supply voltage terminal and a ground terminal. This arrangement accurately detects the power supply voltage level using the resulting RC time constant. Upon power-on of the memory device, a start-up "trip point" for the power supply voltage is determined by the selected values of the resistor and capacitor. Thus, when the power supply voltage level rises to the predetermined trip point, an output signal rises from logical "low" to "high."

The foregoing arrangement more accurately detects the power supply voltage level even where the power supply voltage source is unstable. Unfortunately, this arrangement has its problems. For example, it is difficult to optimize the trip point, since the trip point must change according to the time required for power-on of the memory device. As a result, it is difficult to ensure the reliability of the conventional start-up circuit, since in a $4M(M=2^{20})$ semiconductor memory device, respective trip points vary with their respective power-on time periods. Power-on time periods are typically 200 μs, but can vary from below 1 us to above 200 ms. Such variation results in varying trip-points and reliability suffers.

SUMMARY OF THE INVENTION

It is therefore an object of the present invention to provide a reliable start-up circuit for a semiconductor memory device.

It is another object of the present invention to provide a start-up circuit for a semiconductor memory device which operates with improved reliability by minimizing trip point variation.

It is still another object of the present invention to provide a start-up circuit for a semiconductor memory device which minimizes trip point variation regardless of a power-on time.

It is still further an object of the present invention to provide a start-up circuit which accurately detects a power supply voltage level, and minimizes the trip point variation regardless of the variation of the power-on time to improve the reliability of the semiconductor memory device.

In order to achieve the foregoing objects and other advantages of the present invention, a semiconductor memory device is provided which comprises a start-up circuit accurately detecting a power supply voltage level regardless of variations in the power-on time, wherein the start-up circuit according to the present invention includes a differential amplifier receiving the internal power supply voltage as a source voltage and being driven by the reference signal, such that a level for the power supply voltage is accurately detected. The start-up circuit may also include a driver amplifying an output signal from the differential amplifier to a control signal, and a delay circuit receiving the control signal, delaying the control signal for a time period, and applying the delayed control signal to the differential amplifier.

DESCRIPTION OF THE DRAWINGS

The above objects and other advantages of the present invention will become more apparent upon consideration of a preferred embodiment of the present invention with reference to the attached drawings, in which the similar reference numerals and/or symbols indicate the similar elements:

FIG. 7 is a timing diagram showing timing features of respective signals of FIG. 2.

DETAILED DESCRIPTION OF THE PREFERRED EMBODIMENT

Figure 1:
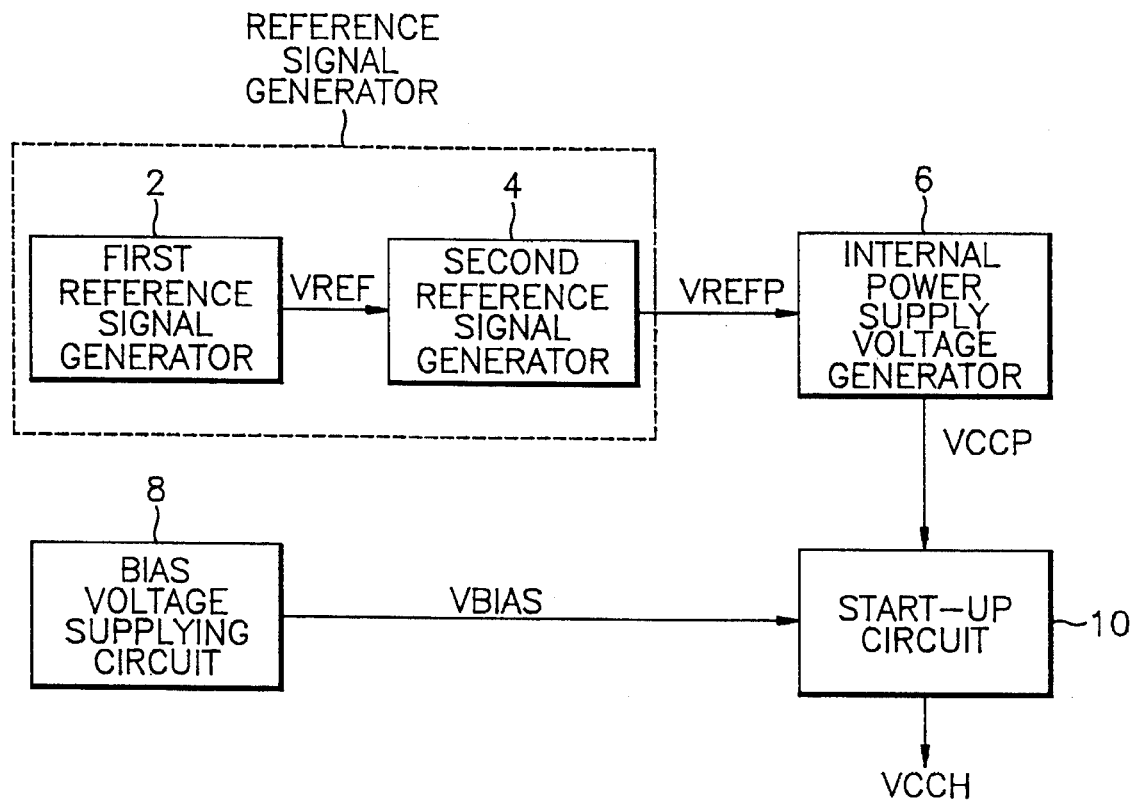
FIG. 1 is a functional block diagram illustrating a start-up circuit according to the present invention within the context of the incorporating memory device.

The term "start-up circuit" used herein means a circuit which detects a power supply voltage level upon power-on of a memory device, and which outputs an enabling signal to internal memory device circuits when the detected level reaches a desired level. FIG. 1 is a functional block diagram illustrating a preferred embodiment of a start-up circuit according to the present invention within a memory device.

The circuit of FIG. 1 comprises a first reference signal generator 2 generating a first reference signal (VREF) upon power-up of the memory device, a second reference signal generator 4 receiving VREF and generating a second reference signal (VREFP), an internal power supply voltage generator 6 receiving VREFP and generating an internal power supply voltage (VCCP), a bias voltage supplying circuit 8 generating a bias voltage (VBIAS) upon power-up of the memory device, and a start-up circuit 10 receiving VCCP from internal power supply voltage generator 6, receiving VBIAS from bias circuit stage 8, and generating an enabling ("start-up") signal (VCCH) which is applied to circuits internal to the memory device.

Thus, start-up circuit 10 receives VCCP and VBIAS, and senses the level of VBIAS to generate start-up signal VCCH. In FIG. 1, the second reference signal generator 4 preferably supplies VREFP to only a peripheral part of the circuit outside a central part in the overall memory device. As shown by dotted-line blocks in FIG. 1, first reference signal generator 2 and second reference signal generator 4 can be used on one reference signal generator depending on the characteristics of the overall memory device.

Figure 2:
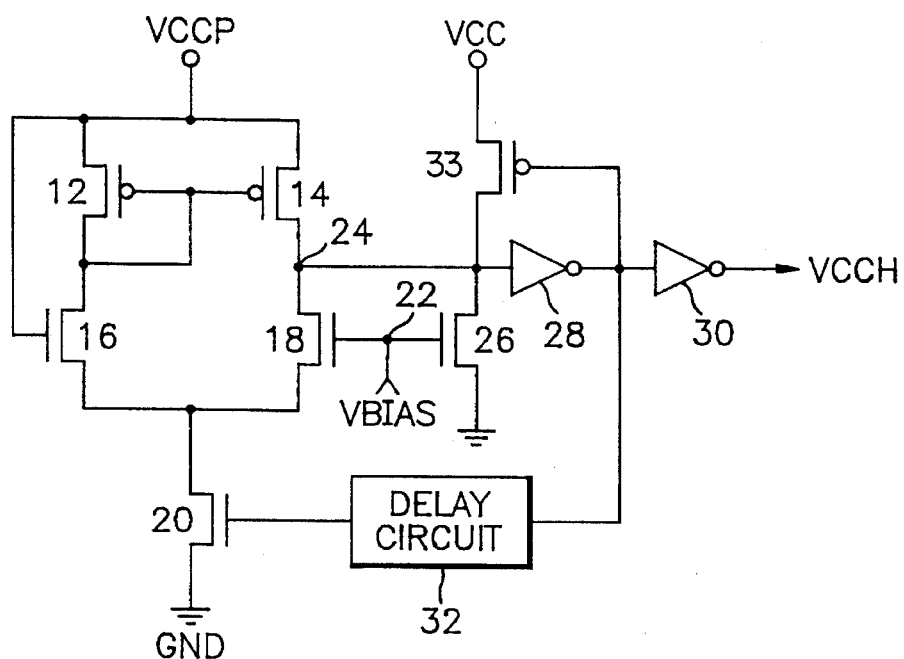
FIG. 2 is a detailed circuit diagram of the start-up circuit 10 of FIG. 1.

FIG. 2 is a detailed circuit diagram of the start-up circuit 10 shown in FIG. 1. Start-up circuit 10 comprises a differential amplifier (12, 14, 16, 18, and 20) placed between internal power supply voltage VCCP and ground (GND). The start-up circuit further comprises an initialization transistor 26 for initializing an output node 24 of the differential amplifier (12, 14, 16, 18, and 20), a driver (28 and 30) for amplifying the output voltage of output node 24, and a delay circuit 32 having an input terminal connected to an output terminal of an inverter 28 and controlling a driving transistor 20 of the differential amplifier (12, 14, 16, 18, and 20) in response to the voltage level to be supplied to the input terminal. The differential amplifier (12, 14, 16, 18, and 20) of start-up circuit 10 is driven to enable the start-up signal VCCH. The driving operation of the differential amplifier is determined by VBIAS supplied from bias voltage supplying circuit 8 of FIG. 1. The respective elements of FIG. 2 cooperate are as follows. Upon power-up of the memory device VBIAS comes up faster than VCCP, conditioning transistors 18 and 26 for conduction before transistor 16 is conditioned for conduction. The initialization transistor 26 pre-charges output node 24 of the differential amplifier (12, 14, 16, 18 and 20) to a logical "low" level close to ground. A driver having two inverters (28 and 30) in cascade connection amplifies the voltage appearing at output node 24 of the differential amplifier (12, 14, 16, 18, and 20). Delay circuit 32 controls the switching operation of driving transistor 20 in response to the output level of inverter 28. As the output node 24 rises toward VCCP potential toward the conclusion of start-up, the output of inverter 28 falls low, the transition to which low voltage after being delayed by the delay circuit 32 removes driving transistor 20 from conduction.

A hold transistor 33 becomes conductive, responsive to the output of inverter 28 applied to its gate going low, to clamp the output node 24 to the external supply voltage VCC and maintain a logical "high" level on the output node 24 the output node 24 despite the current demand of the initialization transistor 26. The channels of the transistors 26 and 33 are proportioned such that their current flows are small compared to the current flow of the driving transistor 20 when it is conductive. When turn-off occurs and VCC decays to a logical level close to ground, the hold transistor 33 is no longer conductive. So initialization procedures wherein the initialization transistor 26 pre-charges output node 24 to a logical "low" level close to ground again become possible. Operation of the start-up circuit shown in FIG. 2 will be discussed below in greater detail with reference to a timing diagram shown in FIG. 7.

Figure 3:
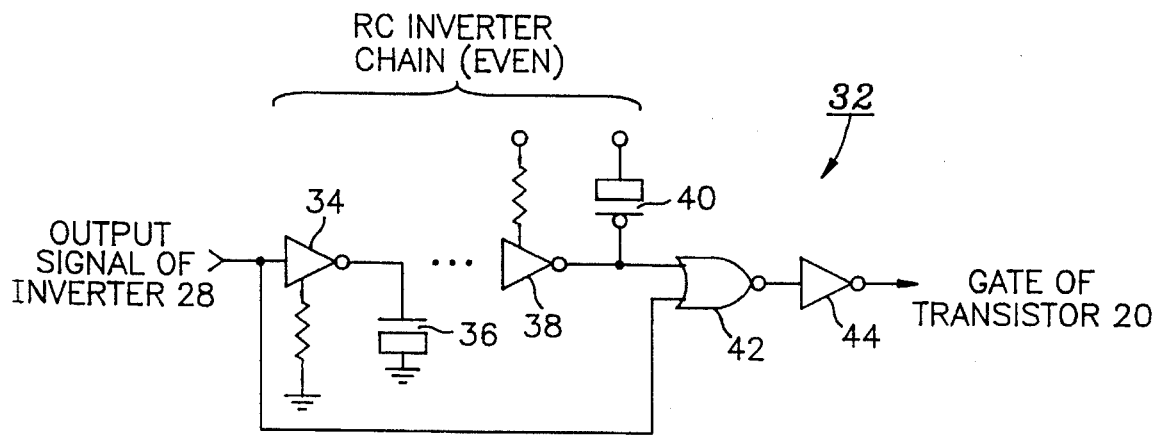
FIG. 3 is a circuit diagram illustrating a preferred embodiment of a delay circuit 32 of FIG. 2.

FIG. 3 is a circuit diagram illustrating a preferred embodiment of the delay circuit 32 shown in FIG. 2. The circuit in FIG. 3 operates to delay the signal applied to output node 24 by a RC inverter chain including inverters 34 and 38, capacitors 36 and 40, and associated resistors. Delay circuit 32 can be easily implemented using other well-known variations to the exemplary circuit.

Figure 4:
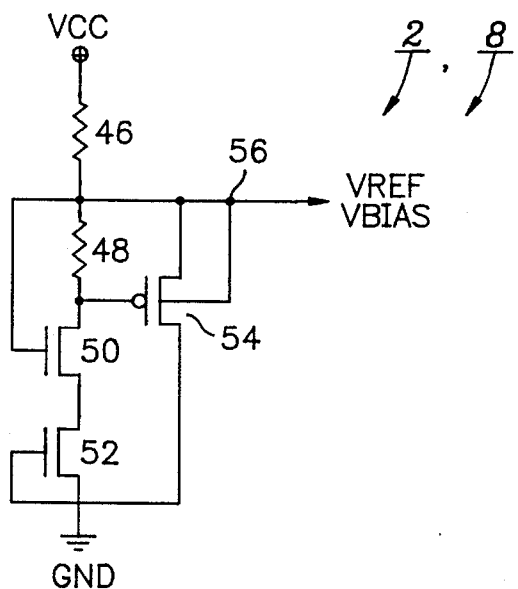
FIG. 4 is a circuit diagram illustrating a preferred embodiment of a first reference signal generator 2 and a bias voltage supplying circuit 8 of FIG. 1.

FIG. 4 is a circuit diagram illustrating a preferred embodiment of the first reference signal generator 2 and/or the bias voltage supplying circuit 8 of FIG. 1. First reference signal generator 2 and/or bias voltage supplying circuit 8 can use the signal generated by the reference voltage generator disclosed on pages 110–111 of the 1992 Symposium on VLSI Circuits Digest of Technical Papers, entitled "Variable Vcc Design Techniques for Battery Operated DRAMs," wherein the voltage level of this circuit is about ½ Vcc or about Vcc–nVth (n=0,1,2,3, . . . ). Such a signal maintains Vgs of transistors in a constant state regardless of variations in Vcc, limits unnecessary power consumption, and minimizes noise. In addition, the device is stable regardless of the external power supply and temperature change.

Figure 5:
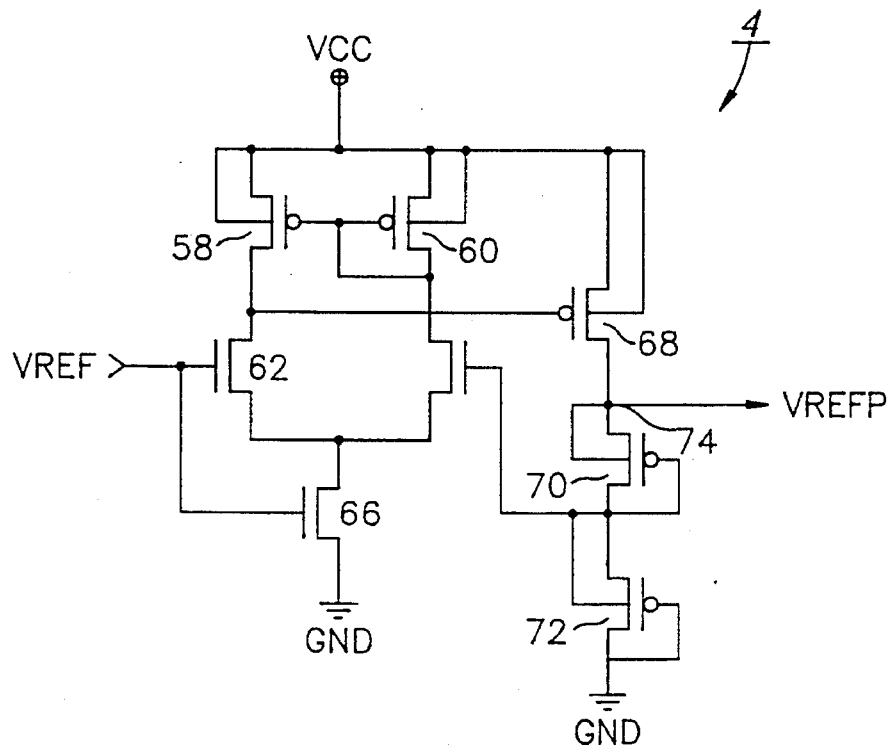
FIG. 5 is a circuit diagram illustrating a preferred embodiment of a second reference signal generator 4 of FIG. 1.

FIG. 5 is a circuit diagram illustrating a preferred embodiment for the second reference signal generator 4 of FIG. 1. The circuit of FIG. 5 generates VREFP in response to the first reference signal VREF provided from first reference signal generator 2 shown in detail in FIG. 4.

Figure 6:
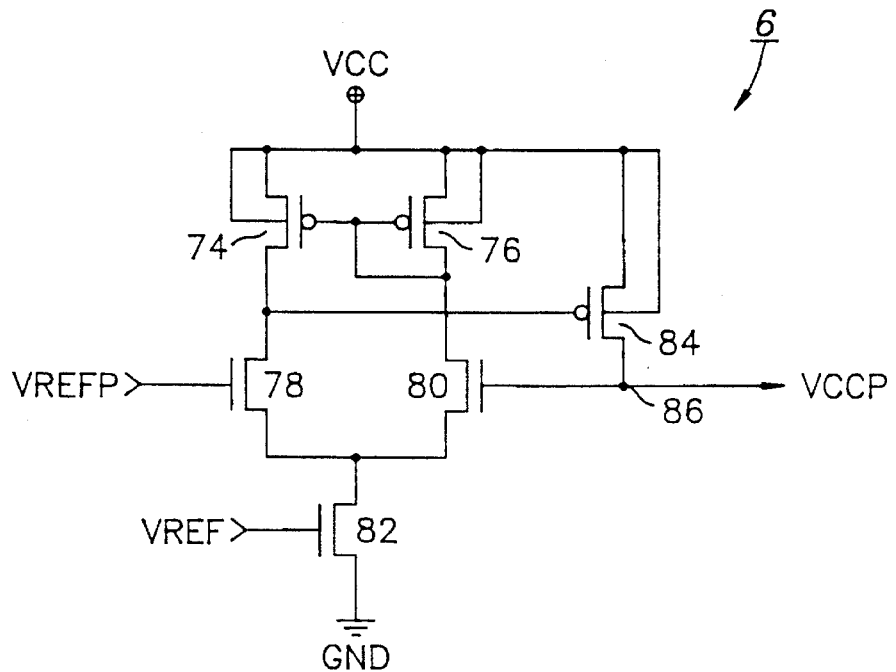
FIG. 6 is a circuit diagram illustrating a preferred embodiment of an internal power supply voltage generator 6 of FIG. 1.

FIG. 6 is a circuit diagram illustrating a preferred embodiment of internal power supply voltage generator 6 of FIG. 1. The construction of FIG. 6 comprises a differential amplifier (74, 76, 78, 80, 82) receiving the first and second reference signals VREF and VREFP and at the same time being driven by the signals VREF and VREFP, and a driver 84 as an output terminal. The VCCP signal generated therefrom is supplied as the source voltage to the start-up circuit of FIG. 2.

Each of the circuits shown in FIGS. 4, 5, and 6 are conventional in nature and readily constructed by those of ordinary skill in the art. FIG. 7 is a timing diagram showing timing characteristics of the respective signals of FIG. 2. Operation of start-up circuit 10 in FIG. 2 will now be described in conjunction with the circuits shown in FIGS. 2–6 and the timing diagram of FIG. 7.

When, upon power-on, the voltage level of the power supply voltage VCC exceeds the nominal threshold voltage of transistors on a memory device, a plurality of the transistors begin to operate. Thus, initialization transistor 26 of FIG. 2 initializes output node 24 of differential amplifier (12, 14, 16, 18, and 20) to a "low" level, thereby maintaining the start-up signal VCCH at a logic "low" level to disable start-up signal VCCH. In this case, each of the source voltages (VCCP) of differential amplifier (12, 14, 16, 18, and 20) and VBIAS are maintained at the same level as the externally supplied power supply voltage VCC, and increased as the power supply voltage VCC increases. Driving transistor 20 of differential amplifier (12, 14, 16, 18, and 20) is gated at a logical "high" level. As a result, differential amplifier (12, 14, 16, 18, and 20) remain turned on. As a result, VBIAS is clamped to a specific level with the gradual increase of the power supply voltage VCC. Thus, VCCP becomes higher than VBIAS at a specific level of the power supply voltage VCC, to enable output node 24 of differential amplifier (12, 14, 16, 18, and 20) to a logic "high" level. More particularly, since the voltage level to which the output signal VCCP of internal power supply voltage generator 6 is clamped, is higher than VBIAS, VBIAS is clamped prior to VCCP, such that there are points at which VCCP is less than VBIAS upon power-up. That is, start-up signal VCCH rises from a logical "low" to "high" when VCC is less than VBIAS upon power-up. The rising slope of VBIAS and VCCP is constant according to the rising slope of the power supply voltage. This results in the VCCH triggering voltage detected from the differential amplifier (12, 14, 16, 18, and 20) being independent of power-up time. Accordingly, the aforementioned objects of the present invention are accomplished.

Upon power-up, the trip point of start-up circuit 10 is set, and then the signal from the inverter 28 of FIG. 2 turns off the circuit using delay circuit 32, thereby halting operation of differential amplifier (12, 14, 16,18, and 20), to reduce power consumption. In the foregoing circuit, the trip point of start-up circuit 10 can be easily changed by adjusting VBIAS. To this with ease, the circuit construction may comprise N bias voltage supplying circuit(s) (where N=1, 2, 3, . . . ) to select one of N bias voltage supply circuit(s) using other methods such as fuse cutting or switching.

The following table contains data obtained from a simulation run to illustrate the variation of the trip point in accordance with power-up time. The data illustrated in the following table shows that the start-up circuit of the present invention is much improved in the variation of the triggering voltage according to the power-up time as compared to the prior art.

| power-up time | 20 μs | 200 μs | 200 ms | Δ V |
| --- | --- | --- | --- | --- |
| prior art | 2.6 V | 2.0 V | 1.1 V | 1.5 V |
| present invention | 1.95 V | 2.0 V | 2.1 V | 0.15 V |

Figure 8:
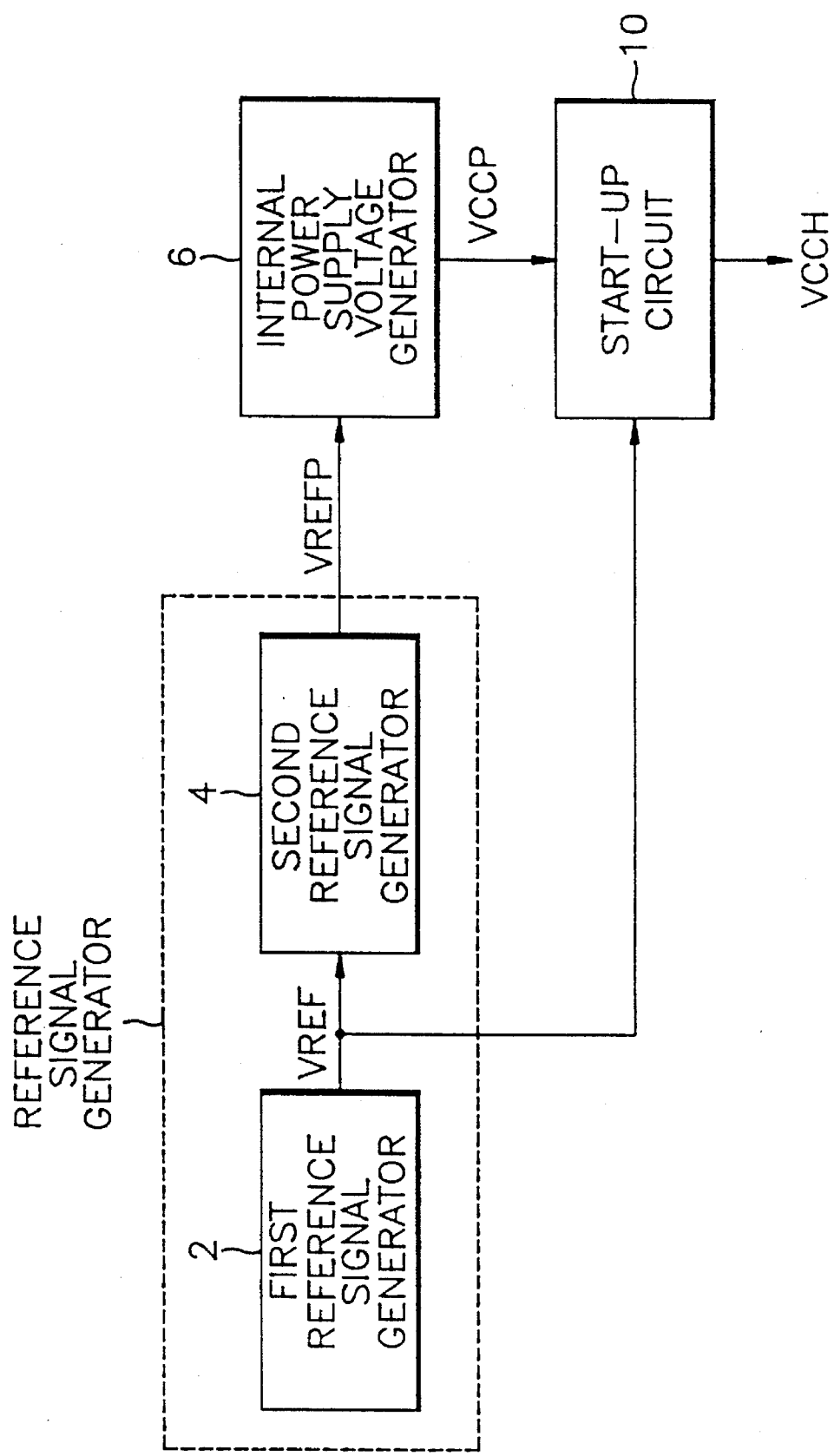
FIG. 8 is a functional block diagram illustrating another preferred embodiment of the start-up circuit according to the present invention.

FIG. 8 is a functional block diagram illustrating another preferred embodiment of the start-up circuit according to the present invention. Compared to FIG. 1, the construction of FIG. 8 does not include bias voltage supplying circuit 80 That is, the construction uses in common the first reference signal VREF from the first reference signal generator 2, without additionally comprising the bias voltage supplying circuit 8 for generating VBIAS which determines the trip point of the start-up circuit. This block construction can be easily implemented by replacing VBIAS signal to be supplied to each gate of the NMOS transistor 18 and of the initialization transistor 26 by VREF signal in the NMOS transistor 18 and of the initialization transistor 26 by VREF signal in construction of FIG. 2. At this time, the trip point can be adjusted by adjusting the size of each transistor of the differential amplifier (12, 14, 16, 18, and 20) in the start-up circuit.

As described above, the start-up circuit according to the present invention overcomes the problems inherent in the prior art by generating a stable start-up signal regardless of the power-up time. In addition, the start-up circuit of the present invention minimizes trip point variation regardless of power-up time, thus producing reliable voltage detector.

In the following description, numerous specific details such as a delay circuit, a bias supplying circuit, a reference voltage generator, etc., are set forth to teach the making and use of the present invention. The preferred embodiment is so given as an example. The present invention is, however, not limited to the specific embodiments described, but is defined by the attached claims. It is apparent to those skilled in the art that the present invention may be implemented with variations and modifications to the specific circuits described.

What is claimed is:

1. In combination within a semiconductor memory device including circuitry requiring that a start-up signal be applied thereto enable its subsequent operation:

a bias voltage supplying circuit for supplying a bias voltage in comparatively fast response to an external power supply voltage applied to said semiconductor memory device;

an internal power supply voltage generator liar supplying an internal power supply voltage in comparatively slow response to said external power supply voltage applied to said semiconductor memory device; and a start-up circuit for generating said start-up signal when said external power supply voltage reaches a predetermined value as compared to said bias voltage, which said start-up signal is applied to said circuitry requiring that a start-up signal be applied thereto to enable its subsequent operation, said start-up circuit comprising:

first, second and third terminals for receiving said internal power supply voltage supplied by said internal power supply voltage generator, said bias voltage supplied by said circuit for supplying a bias voltage, and a common reference ground potential, respectively;

first and second transistors of a first conductivity type having respective drain electrodes respectively connected to a first node and to a second node, having respective source electrodes connected to a third node, and having respective gate electrodes to which said first terminal and said second terminal are respectively connected;

third and fourth transistors of a second conductivity type complementary to said first conductivity type having respective source electrodes connected to a fourth node and thence to said first terminal, having respective drain electrodes respectively connected to said first node and to said second node, and having respective gate electrodes to which potential at said first node is applied;

a first logic inverter having an input connection directly from said second node without any substantial intervening element and having an output connection for supplying first logic inverter response;

a second logic inverter having an input connection directly from the output connection of said first logic inverter without any substantial intervening element and having an output connection for supplying second logic inverter response, applied as said start-up signal to said circuitry requiring said start-up signal;

a fifth transistor of said first conductivity type having a source electrode connected to said third terminal, having a drain electrode connected to said third node, and having a gate electrode; and a delay circuit for delaying said first logic inverter response as supplied from the output connection of said first logic inverter and applying the resulting first logic inverter response to the gate electrode of said fifth transistor.

2. The combination set forth in claim 1 wherein said delay circuit includes no combinatorial logic.

3. The combination set forth in claim 2 wherein said start-up circuit further comprises:

means for causing a pre-charge current to flow between said second node and said third terminal.

4. The combination set forth in claim 3 wherein said means for causing a pre-charge current to flow between said third node and said third terminal comprises:

a sixth transistor of said first conductivity type having a gate electrode connected to said second terminal, having a source electrode connected to said third terminal, and having a drain electrode connected to said second node.

5. The combination set forth in claim 1 wherein said delay circuit comprises a cascade connection of logic inverters, each with shunt capacitance output load and with resistance in a power supply connection thereof.

6. The combination set forth in claim 5 wherein said start-up circuit further comprises:

means for causing a pre-charge current to flow between said second node and said third terminal.

7. The combination set forth in claim 6 wherein said means for causing a pre-charge current to flow between said third node and said third terminal comprises:

a sixth transistor of said first conductivity type having a gate electrode connected to said second terminal, having a source electrode connected to said third terminal, and having a drain electrode connected to said second node.

8. The combination set forth in claim 1 wherein said start-up circuit further comprises:

means for causing a pre-charge current to flow between said second node and said third terminal.

9. The combination set forth in claim 8 wherein said means for causing a pre-charge current to flow between said third node and said third terminal comprises:

a sixth transistor of said first conductivity type having a gate electrode connected to said second terminal, having a source electrode connected to said third terminal, and having a drain electrode connected to said second node.

* * * * *